(12) United States Patent
Mulig et al.

(10) Patent No.: US 6,671,848 B1
(45) Date of Patent: Dec. 30, 2003

(54) TEST CIRCUIT FOR EXPOSING HIGHER ORDER SPEED PATHS

(75) Inventors: Jason Dale Mulig, Austin, TX (US); Arnold Louie, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 328 days.

(21) Appl. No.: 09/813,339

(22) Filed: Mar. 20, 2001

(51) Int. Cl.[7] ............... G01R 31/28; G06F 11/00; G06F 1/04
(52) U.S. Cl. ................... 714/744; 713/500
(58) Field of Search .............. 714/798, 724, 714/733, 734, 738, 744, 745; 713/500, 502, 503, 600

(56) References Cited

U.S. PATENT DOCUMENTS

| 6,052,811 A | 4/2000 | Ahsuri |
| 6,071,003 A | 6/2000 | Ashuri et al. |
| 6,123,770 A * | 9/2000 | Koskinen et al. ........... 118/110 |
| 6,127,858 A | 10/2000 | Stinson et al. |
| 6,170,069 B1 * | 1/2001 | Ohtani et al. .............. 714/704 |
| 6,510,534 B1 * | 1/2003 | Nadeau-Dostie et al. ... 714/724 |
| 6,571,357 B1 * | 5/2003 | Martin et al. ................. 714/28 |

* cited by examiner

*Primary Examiner*—Christine T. Tu
(74) *Attorney, Agent, or Firm*—Meyertons Hood Kivlin Kowert & Goetzel, P.C.; B. Noël Kivlin

(57) ABSTRACT

A test circuit for exposing higher order speed paths. A test circuit includes a clock generation circuit coupled to a test clock control unit. The clock generation circuit is configured to receive an input clock signal and to generate an output clock signal. The test clock control unit is configured to selectively provide a user programmable test vector or a fixed test vector to control the generation of the output clock signal by the clock generation circuit depending upon a state of a first mode select signal.

24 Claims, 7 Drawing Sheets

| OUTPUT CORE CLOCKWAVE FORM | TP TRIG MODE | TEST VECTOR VALUE | TEST VECTOR NAME |
|---|---|---|---|
| A | 0 X | 1 1 1 1 1 1 1 1 1 1 1 1 1 1 1 1 [1 TRAILING BIT = 1] | BYPASS |
| B | 1 1 | 1 1 0 0 0 0 0 1 1 1 1 1 1 1 1 1 [1 TRAILING BIT = 1] | PROGRAMMABLE |
| C | 1 1 | 1 1 1 1 1 1 0 0 0 0 0 1 1 1 1 1 1 TRAILING BIT = 1 | PROGRAMMABLE |
| D | 1 1 | 1 1 1 1 1 1 1 1 1 0 0 0 0 0 1 1 1 TRAILING BIT = 1 | PROGRAMMABLE |
| E | 1 1 | 1 1 1 1 1 1 1 1 1 1 1 1 1 0 0 0 1 TRAILING BIT = 1 | PROGRAMMABLE |
| F | 1 0 | 1 0 1 0 1 0 1 0 1 0 1 0 1 0 1 0 [1 TRAILING BIT = 1] | FIXED |

Fig. 5C

TEST CIRCUIT FOR EXPOSING HIGHER ORDER SPEED PATHS

BACKGROUND OF THE INVENTION

1. Field of the Invention

This invention relates to test circuits and, more particularly, to clock control during testing.

2. Description of the Related Art

During the manufacturing life cycle of an electrical circuit, there may be many levels of circuit testing. For example, during the design phase, circuit designers may initiate several test simulations on their designs to ensure that the designs meet a set of specifications prior to releasing their designs to the next stage of manufacturing. Additionally, a test or product engineer may develop an extensive suite of test programs that run on manufacturing testers. These test programs are typically designed to screen out circuit defects that may have occurred during the manufacturing process.

In addition, once a circuit design has completed an initial manufacturing process it is often tested using a specialized test program that is commonly referred to as a characterization program. Many characterization programs are developed to detect not only manufacturing defects, but also any design flaws that may have been inadvertently designed into the circuit and escaped earlier simulations. Characterization programs may therefore need to test a circuit to its physical limits. In contrast, a production test program may be designed to only test a circuit within a prescribed set of limits. The limits are in many cases determined through the use of the characterization program. A characterization program may repetitively exercise a circuit using the same tests while varying such parameters as supply voltage, applied clock frequency and ambient operating temperature. In this way, the circuit's operation may be characterized across a wide range of voltage, frequency and temperature.

When a defect is detected or an operational limit is reached during characterization, in many cases the characterization test program or test patterns are modified to continue characterization despite the defect or operational limit. However, if the circuit is an integrated circuit, there may be many factors that make it difficult to continue the characterization process by making program and pattern modifications alone. For example, the type of integrated circuit, the available test modes and the available external circuit package leads may make program and pattern changes alone impractical or impossible. This may be particularly true for frequency dependent failures in circuits containing a clock generator circuit such as phased lock loop (PLL) circuit. In some cases, the circuit defect may have to be fixed and the circuit sent through the manufacturing process again before any higher order defects may be detected. This may become an expensive iterative process until all the defects that prevent characterization are fixed. Thus, an efficient method of allowing circuit testing to continue despite circuit defects is desired.

SUMMARY OF THE INVENTION

Various embodiments of a test circuit for exposing higher order speed paths are disclosed. In one embodiment, a test circuit includes a clock generation circuit coupled to a test clock control unit. The clock generation circuit is configured to receive an input clock signal and to generate an output clock signal. The test clock control unit is configured to selectively provide a user programmable test vector or a fixed test vector to control the generation of the output clock signal by the clock generation circuit depending upon a state of a first mode select signal.

In one particular implementation, the user programmable test vector and the fixed test vector are multiple-bit binary values. The test clock control unit may be configured to store the user programmable test vector in a programmable register. In other implementations, the test clock control unit may be configured to select either of the user programmable test vector or the fixed test vector using a first plurality of multiplexers, one for each bit of the user programmable test vector and the fixed test vector. The input select of each of the first plurality of multiplexers may be controllable by the first mode select signal.

In other implementations, the test clock control unit may be configured to selectively provide a multiple-bit bypass test vector to control the generation of the output clock signal by the clock generation circuit depending upon a state of a second mode select signal. In addition, the test clock control unit may be configured to serially shift each bit of the user programmable test vector, the fixed test vector and the bypass test vector to the clock generation circuit using a shift register.

BRIEF DESCRIPTION OF THE DRAWINGS

FIG. 5C is a table of test vectors corresponding to the waveforms of FIG. 5A and FIG. 5B.

Figure 1:
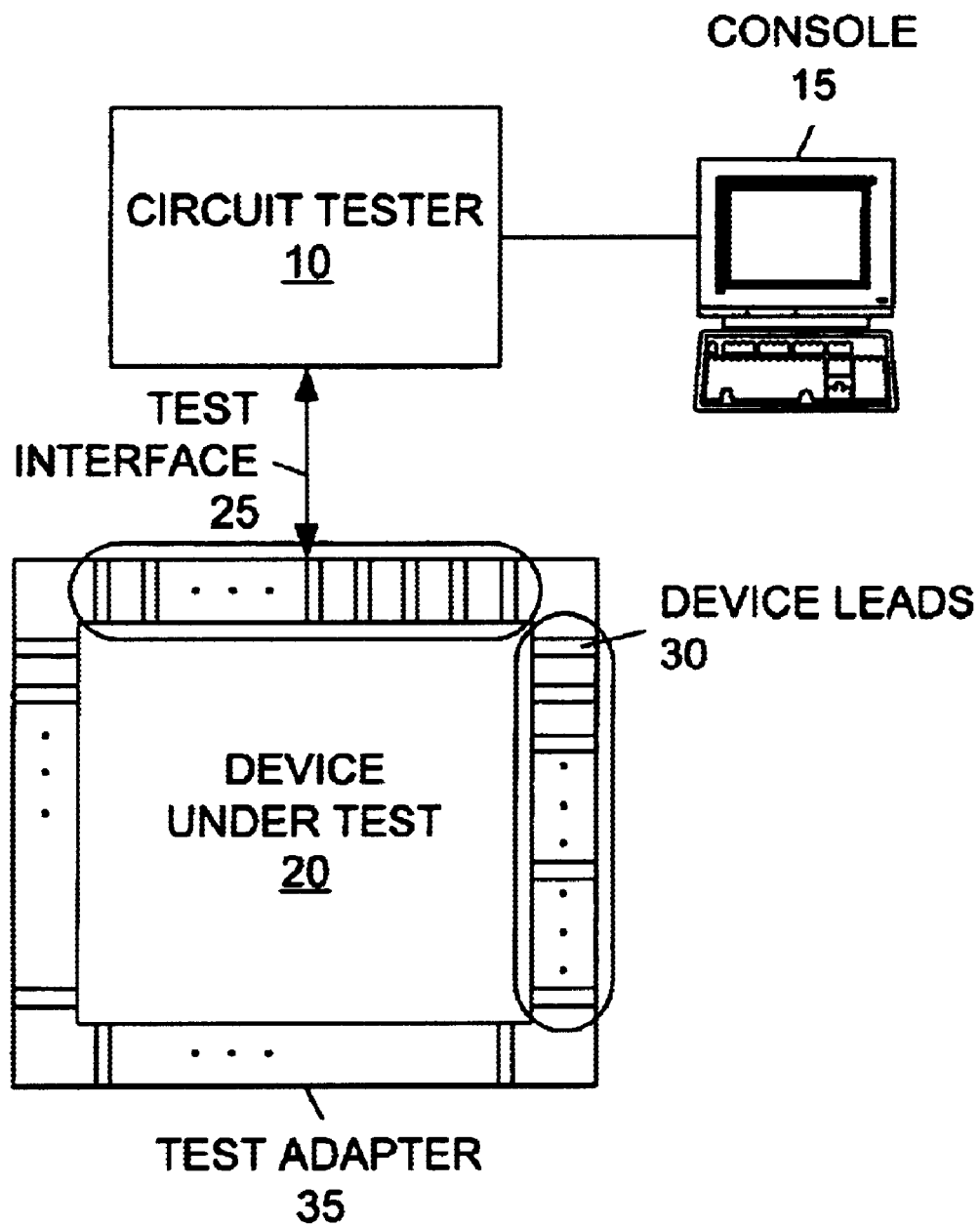
FIG. 1 is a diagram of one embodiment of a circuit tester and a device under test.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to FIG. 1, a diagram of one embodiment of a circuit tester and a device under test is shown. Circuit tester 10 is connected to a device under test 20 through a test interface 25 and a test adapter 35. A user console 15 is also connected to circuit tester 25.

Test adapter 35 may be a specialized test socket which is designed specifically for device under test 35 or it may be a general-purpose test socket. Test adapter 35 is typically used to provide connections from circuit tester 10 signals such as a test clock and various input and output signals to each of the device leads 30 on device under test 20.

In the illustrated embodiment, circuit tester 10 may be a complex computerized test system which may contain multiple processors, multiple banks of random access memory (RAM), read-only memory (ROM) as well as mass storage devices such as disk drives (all not shown). Circuit tester 10 may be programmed through user console 15 to run test programs written in a variety of programming languages.

A test program is typically used to communicate with circuit tester 10. The test program may run code that includes instructions which pre-condition device under test 20. The code may vary such device parameters as the input voltage and input clock frequency. To communicate with device under test 20, tester files commonly referred to as test patterns are used. The inputs and outputs of device under test 20 are typically stimulated and monitored using values in the test patterns. The values in the test pattern are represented by test vectors, which may direct the tester when to apply specific stimuli to a device's inputs and when to monitor a device's outputs for expected values. Therefore, the test program may run code to pre-condition device under test 20 and then call a particular test pattern. Thus, as device under test 20 is pre-conditioned, the inputs of device under test 20 may be stimulated while the outputs are monitored and compared against expected values. The test program may then provide a pass or fail indication based on the results of the comparison. As used herein, a test vector is a value or a group of values that may either be stimulus values or expected values. Test vectors may cause device under test 20 to operate in various modes. As will be described further below, a test vector may be applied to device under test 20 through hardware and as software.

Figure 2:
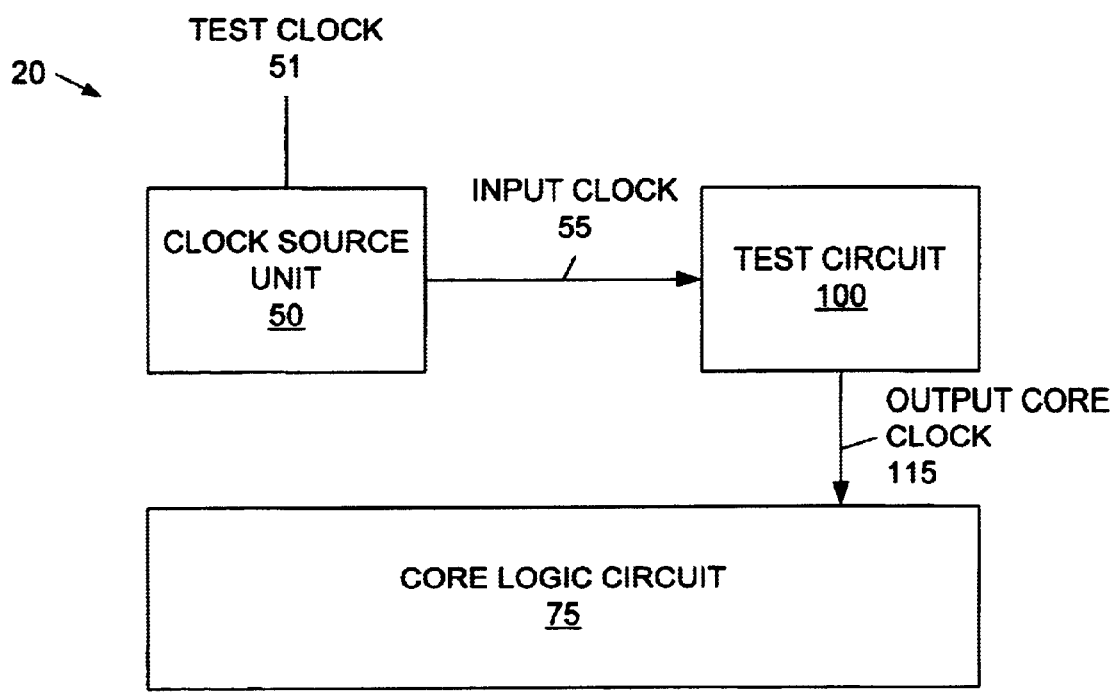
FIG. 2 is a block diagram of one embodiment of a device under test.

Referring now to FIG. 2, a block diagram of one embodiment of a device under test is illustrated. Diagram components that correspond to those shown in FIG. 1 are numbered identically for simplicity and clarity. Device under test 20 of FIG. 2 includes a clock source unit 50 coupled to test circuit 100. Test circuit 100 is coupled to core logic circuit 75.

In the illustrated embodiment, clock source unit 50 is provided with a test clock 51 from circuit tester 10 of FIG. 1. It is contemplated that in other embodiments, test clock 51 may be provided by any external clock source such as a crystal oscillator or other clocking device. Clock source unit 50 may be a phased lock loop (PLL) circuit which may provide a phase locked multiple of test clock 51 as an output. However, it is contemplated that any suitable clocking circuit may be used.

Test circuit 100 receives an input clock 55 from clock source unit 50 and provides an output core clock 115 to core logic circuit 75. Test circuit 100 receives control inputs from circuit tester 10 of FIG. 1. In FIG. 2 a transmit data in (TDI) and a transmit data out (TDO) pin provide test circuit 100 with a joint test action group (JTAG) interface which allows serial information to be sent to and received from test circuit 100. Test circuit 100 also includes control inputs TRIG and MODE. As will be described in greater detail below, the TRIG and MODE pins control the frequency and edge timing of output core clock 115, while the TDI and TDO pins allow a user to store a user programmable test vector into test circuit 100.

Figure 3:
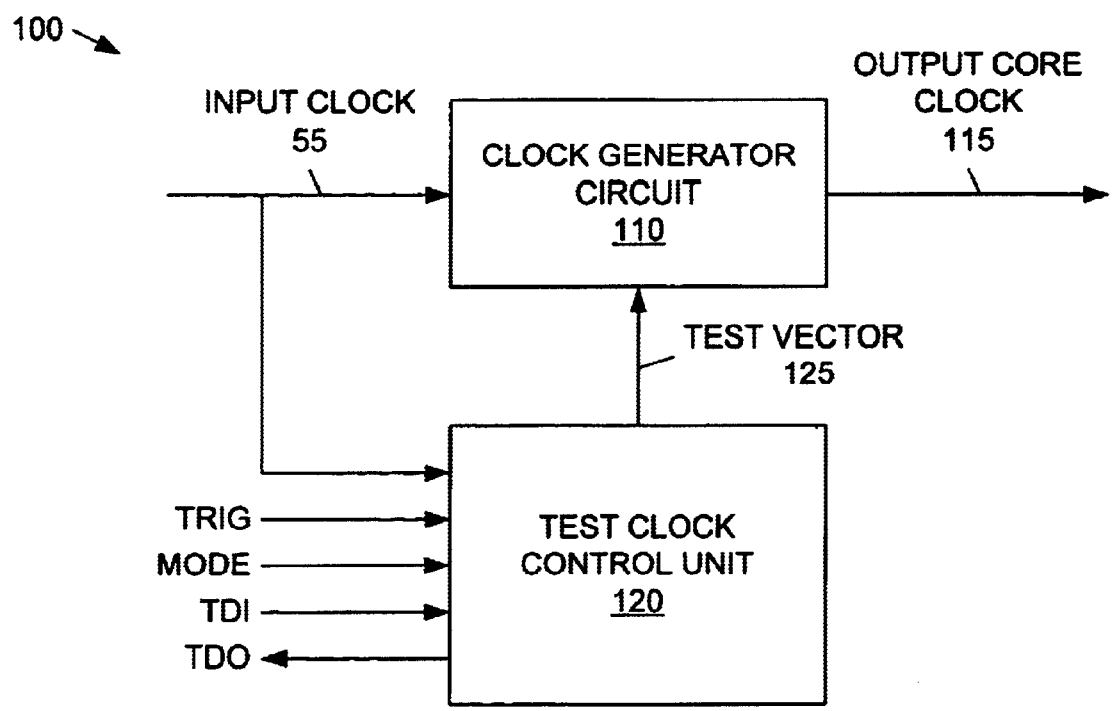
FIG. 3 is a block diagram of one embodiment of the test circuit of FIG. 2.

Now turning to FIG. 3, a block diagram of one embodiment of the test circuit of FIG. 2 is shown. Diagram components that correspond to those shown in FIG. 1 and FIG. 2 are numbered identically for simplicity and clarity.

Test circuit 100 includes a clock generator circuit 110 which is coupled to a test clock control unit 120. As described above, clock generator circuit 110 receives an input clock 55 from clock source unit 50 and provides an output core clock 115 to core logic circuit 75. Test clock control unit 120 receives control inputs TRIG and MODE, while the TDI and TDO pins provide test input/output (I/O) and programmability to test clock control unit 120. Test clock control unit 120 also receives input clock 55.

In one embodiment, test clock control unit 120 may provide a test vector 125 to clock generator circuit 110. Test vector 125 controls the generation of output core clock 115. As will be described in more detail below, depending on the state of control pins TRIG and MODE, test vector 125 may cause clock generator circuit 110 to provide an output core clock 115 that is the same frequency as input clock 55 or a slower frequency than input clock 55. In addition, using the TDI pin, a user may store a user programmable test vector in test clock control unit 120. Thus, a user may vary the frequency of output core clock by changing the states of the TRIG and MODE control inputs.

Figure 4:
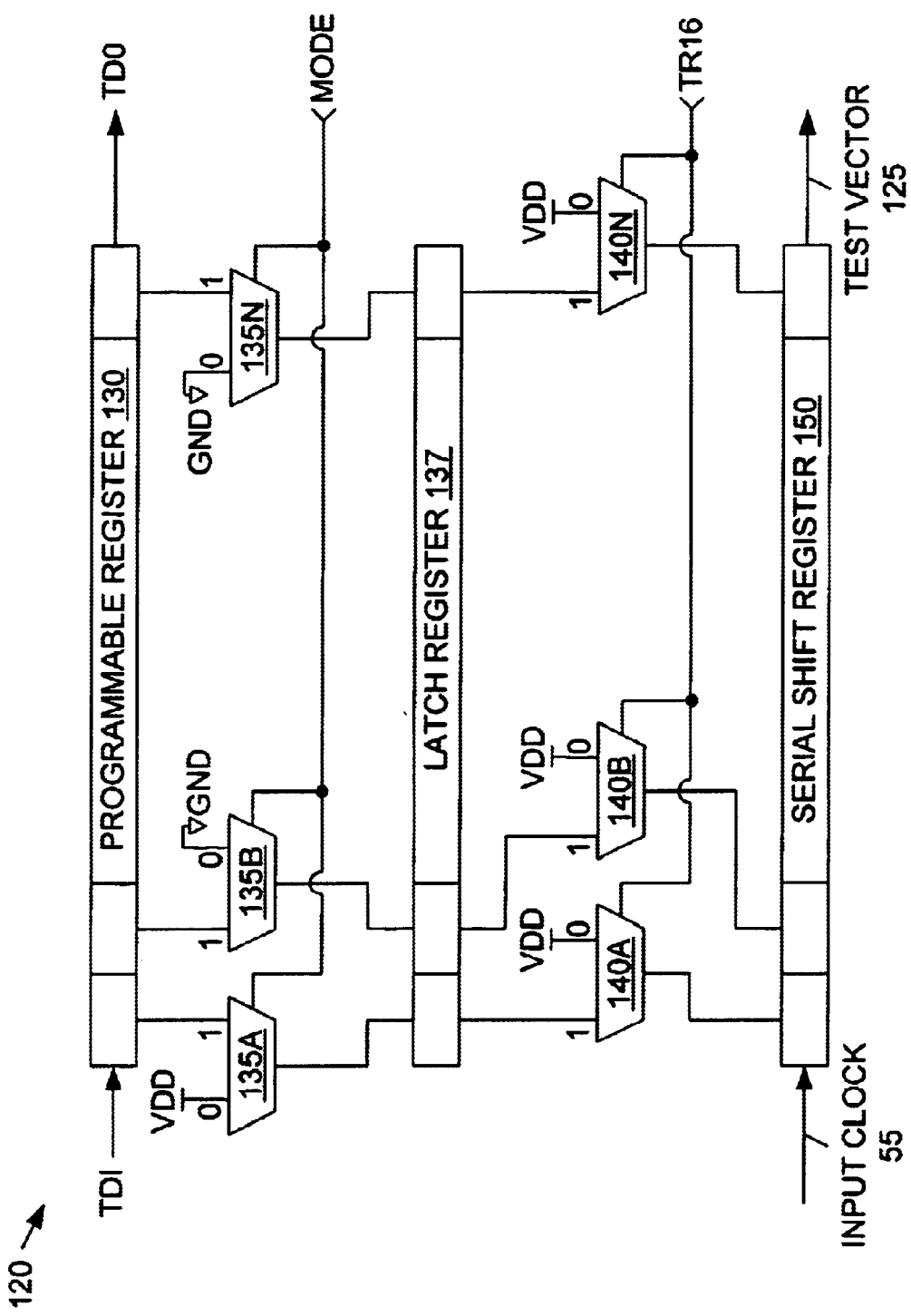
FIG. 4 is a block diagram of one embodiment of the test clock control unit of FIG. 3.

Referring to FIG. 4, a block diagram of one embodiment of the test clock control unit of FIG. 3 is shown. Diagram components that correspond to those shown in FIG. 3 are numbered identically for simplicity and clarity. Test clock control unit 120 includes a programmable register 130 coupled to a latch register 137 through a multiplexer bank 135 containing multiplexers 135A through 135N. There is one multiplexer 135A–N for each bit in programmable register 130. The number of bits in programmable register 130 corresponds to at least four times the phase locked multiple of test clock 51. In one embodiment, programmable register 130 has 16 bits corresponding to a clock multiplier of four. However, it is contemplated that in other embodiments programmable register 130 may contain any suitable number of bits. Latch register 137 is coupled to serial shift register 150 through a second multiplexer bank containing multiplexers 140A through 140N. There is one multiplexer 140A–N for each bit in latch register 137.

Programmable register 130 may be programmed to hold a user programmable test vector through the TDI pin, which is part of the JTAG interface. During testing, a test program may access the JTAG interface and scan a value into programmable register 130. In addition, the JTAG interface may be used to test the functionality of programmable register 130 by scanning the contents of programmable register 130 out to the TDO pin.

In the illustrated embodiment, each multiplexer 135A–N has two inputs, an output and an input select. One input is the output of one bit of programmable register 130. If that input is selected, the user programmable test vector will be output from multiplexers 135A–N. The other input is a hard-wired voltage level and therefore a fixed binary value. In a preferred embodiment, the fixed voltage level is VDD on some multiplexers and circuit ground on others forming an alternating pattern of ones and zeros. Thus, if the fixed input is selected, a fixed test vector will be output from multiplexers 135A–N. Latch register 137 may capture the output of multiplexers 135A–N. The input select signal for multiplexers 135A–N is the MODE signal. It is contemplated that in other embodiments, other combinations of fixed voltage levels may be used to form other fixed test vector patterns. Alternatively, in other embodiments, a programmable register may be used to hold the fixed vector.

Additionally, each multiplexer 140A–N has two inputs, an output and an input select. One input is the output of one bit of latch register 137. If that input is selected, either the user programmable test vector or the fixed test vector will be output from multiplexers 140A–N depending on the state of the MODE signal. The other input of multiplexers 140A–N is a hard-wired fixed voltage level and therefore a fixed binary value. In the illustrated embodiment, the fixed voltage level is VDD and therefore a binary one. Thus, if the fixed input is selected, a fixed bypass test vector containing all binary ones will be output from multiplexers 140A–N. The input select signal for multiplexers 140A–N is the TRIG signal. It is contemplated that in other embodiments, the fixed voltage level may cause a fixed bypass test vector containing other binary values. It is also noted that the multiplexer input select polarities in the illustrated embodiment are shown as an example only and that in other embodiments other polarities are contemplated and may be used.

The output of multiplexers 140A–N is connected to serial shift register 150. Serial shift register 150 receives all the bits of whichever test vector is selected by the TRIG and MODE signals. As serial shift register 150 receives clock edges from input clock 55, one or more bits are shifted out of serial shift register 150 as test vector 125.

Figure 5A:
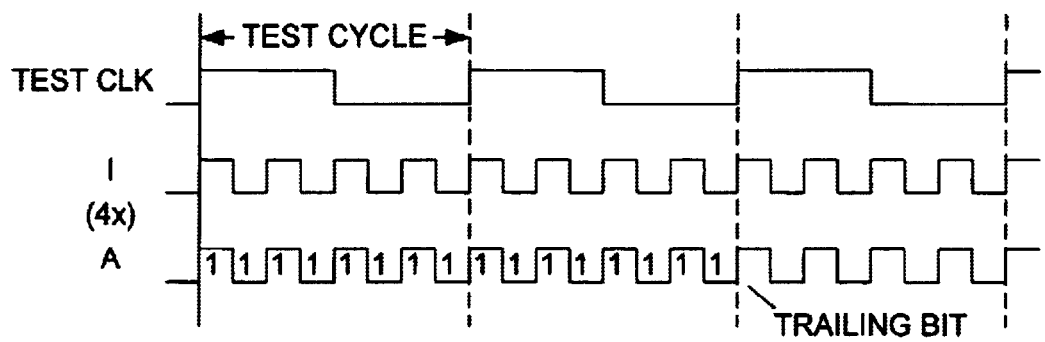
FIG. 5A is a timing diagram illustrating an output core clock waveform using one embodiment of a bypass test vector.

Turning now to FIG. 5A, a timing diagram illustrating an output core clock waveform using one embodiment of a bypass test vector is shown. The timing diagram includes a test CLK waveform, a waveform 'I' and a waveform 'A'. Test CLK is a user programmable clock that is an output from circuit tester 10 of FIG. 1. The test CLK waveform may be controlled by the test program and test pattern. Waveform 'I' of FIG. 5A is the input clock 55 of FIG. 3 and waveform 'A' of FIG. 5A is the waveform of output core clock 115 of FIG. 3.

In FIG. 5A waveform 'I' has a frequency that is 4 times faster than test CLK. It is noted that waveform 'I' is an exemplary waveform only. It is contemplated that since the clock source 50 of FIG. 2 may be programmed, waveform 'I' of FIG. 5C may be any suitable multiple of test CLK. As will be described in greater detail below in conjunction with FIG. 5C, a particular test vector when provided to clock generator circuit 110 of FIG. 3 may yield waveform 'A' of FIG. 5A. In this particular illustration, the test vector is a fixed bypass test vector containing all ones.

Figure 5B:
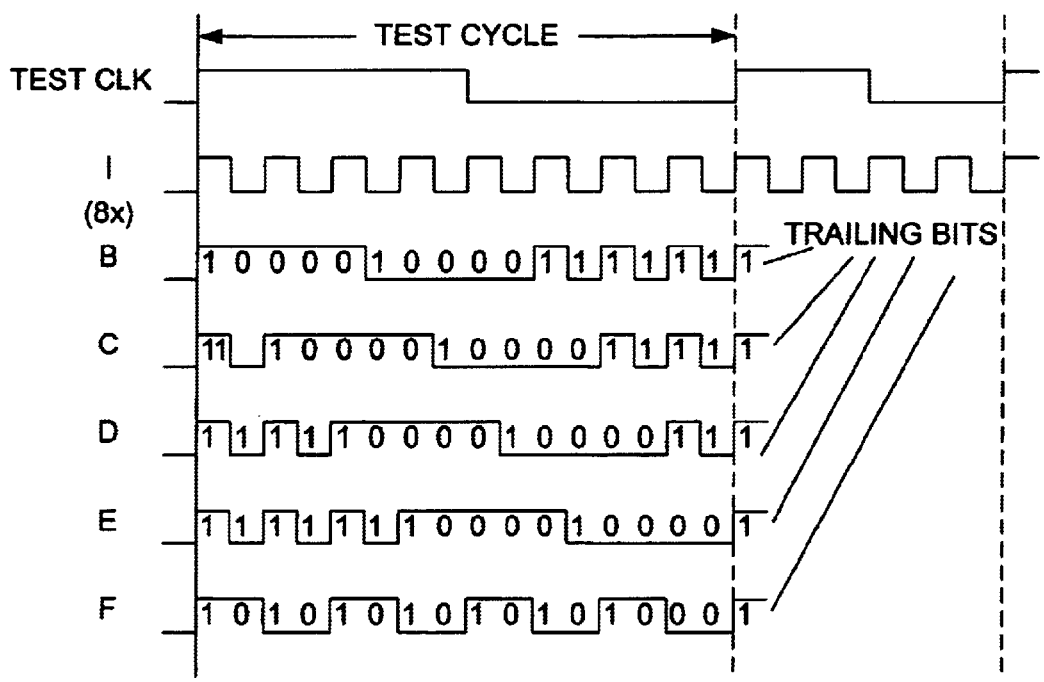
FIG. 5B is a timing diagram illustrating various output core clock waveforms using various embodiments of test vectors.

Referring to FIG. 5B, a timing diagram illustrating various output core clock waveforms using various test vectors is shown. The timing diagram includes a test CLK waveform and waveforms I, B, C, D, E and F. As described above in conjunction with FIG. 5A, test CLK of FIG. 5B is also a user programmable clock that is an output from circuit tester 10 of FIG. 1. The test CLK waveform may be controlled by the test program and test pattern. In addition, waveform 'I' of FIG. 5B is the input clock 55 of FIG. 3 and waveforms B, C, D, E and F of FIG. 5B are waveforms of output core clock 115 of FIG. 3.

In the FIG. 5B, waveform 'I' has a frequency that is 8 times the frequency of test CLK during one test cycle. Thus, waveform 'I' has 16 clock edges and therefore 8 clock cycles and waveforms B, C, D, E and F have only 8 edges and 4 clock cycles within one test cycle. In addition, in waveforms B, C, D and B one of the clock cycles is effectively stretched to ¼ the frequency of the cycles in waveform 'I', while in waveform 'F' each cycle has been stretched to ½ the frequency of the cycles in waveform 'I'. Waveforms B, C, D and E differ in that the stretched cycles occur at different times during the test cycle. These cycle stretches effectively slow down output core clock 115 of FIG. 3 during a given test cycle. As will be described in greater detail below in conjunction with FIG. 5C, a series of test vectors, when provided to clock generator circuit 10 of FIG. 3, may yield waveforms B, C, D, E and F of FIG. 5B. In this particular illustration, the test vectors provided in waveforms B, C, D and E are user programmable test vectors and the test vector provided on waveform 'F' is a fixed test vector.

Turning now to FIG. 5C, a table of test vectors corresponding to the waveforms of FIG. 5A and FIG. 5B is shown. The table includes the output core clock waveforms A through F, the TRIG and MODE select signal states, the test vector value and the test vector name used to generate the corresponding waveforms.

In the first row, the settings for waveform 'A' of FIG. 5A are shown. The TRIG and MODE pins may have the state 0 and X respectively. The 'X' denotes a don't-care state. The test vector value is all ones and the test vector is a bypass test vector. In the second row, the settings for waveform 'b' of FIG. 5B are shown. The TRIG and MODE pins have the state 1 and 1 respectively. The test vector value is 10000100001111111 and the test vector is a programmable test vector. Similarly, waveforms C, D, and E are generated using the settings in the table. In the last row of FIG. 5C, the settings for waveform 'F' of FIG. 5B are shown. The TRIG and MODE pins have the state 1 and 0 respectively. The test vector value is 10101010101010101 and the test vector is a fixed test vector.

In the illustrated embodiment, the last bit of each test vector is a trailing bit. In one embodiment, the trailing bit may always be a one, enabling the clock generator circuit 110 of FIG. 3 to revert to the appropriate waveform for the next test cycle. In other embodiments, the trailing bit may also be programmable. If the trailing bit is programmed to a zero, then the output core clock may be effectively stopped. If used in conjunction with other test modes, the current state of all testable flip-flops may be viewed after an appropriate test vector value has been cycled. It is noted that the TRIG and MODE states shown in FIG. 5C are exemplary values only and that in other embodiments other suitable values may be used. In addition, it is noted that other suitable test vector values are contemplated and may be used.

Figure 6:
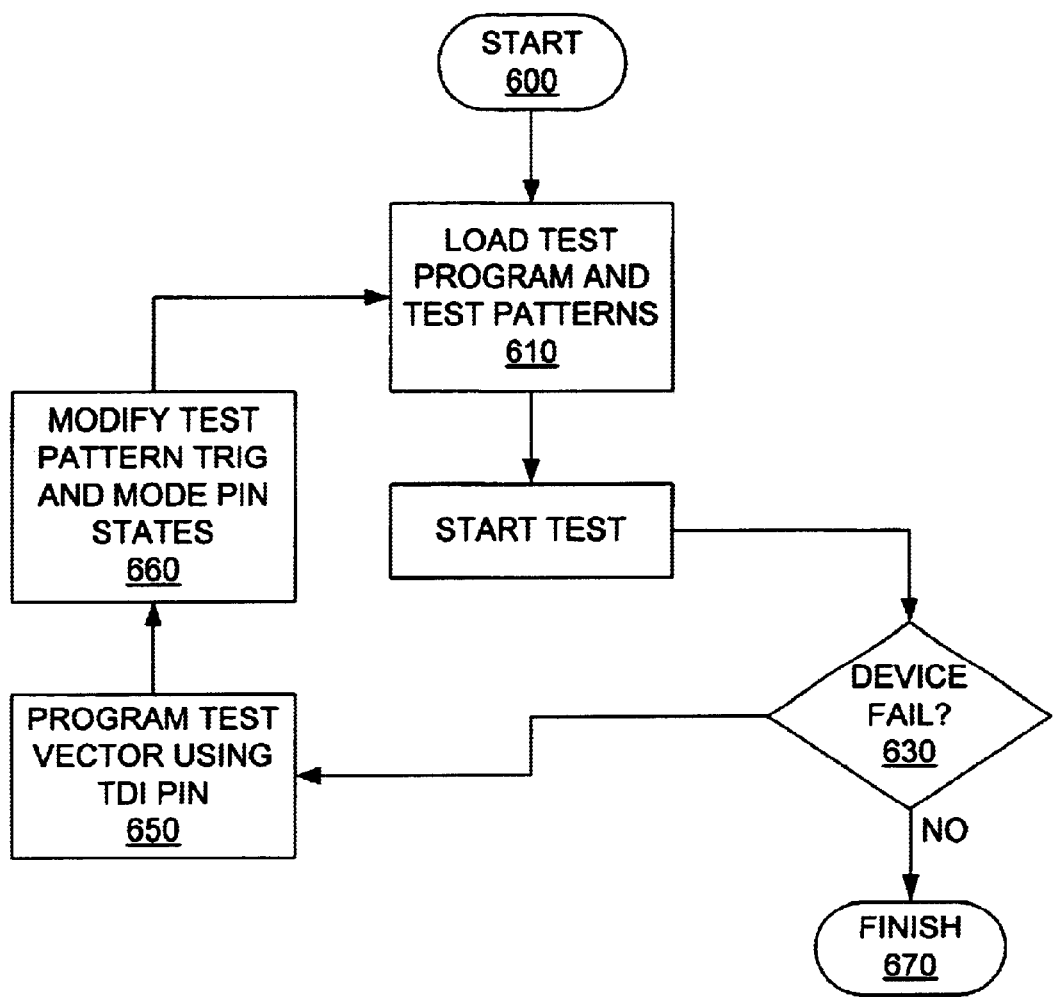
FIG. 6 is a flow diagram of the operation of one embodiment of a test circuit.

Referring to FIG. 6, a flow diagram of the operation of one embodiment of a test circuit is shown. During device characterization, circuit tester 10 of FIG. 1 may indicate that device under test 20 of FIG. 1 has failed a particular test at a specific location in the test pattern. Should such a failure occur, the flow diagram of FIG. 6 depicts the steps that may be taken to find any additional failures.

Starting at step 610 a user loads the test program and test patterns into the tester memory. The test pattern contains a configuration of the TRIG and MODE pins such that test clock control unit 130 of FIG. 2 may provide a fixed bypass vector to clock generator circuit 110, thus preventing clock generator circuit 110 from stretching any clock cycles. Proceeding to step 620 of FIG. 6, the test program is started and device under test 20 is conditioned and stimulated under varying device parameters. Proceeding to step 630, circuit tester 10 monitors device under test 20 for any failures. If no failures are detected, operation proceeds to step 670 where additional tests may be performed if necessary. Referring back to step 630, if a failure is detected, a user annotates the failing location in the test pattern. Operation now proceeds to step 650. The user programs a suitable test vector into programmable register 130 of FIG. 5 using the TDI pin and operation proceeds to step 660. The user modifies the test pattern which may be stored in pattern memory by reconfiguring the TRIG and MODE pin states to cause test clock control unit 130 of FIG. 2 to provide the programmable test vector to clock generator circuit 110 thereby stretching one or more of the output core clock cycles. Operation now proceeds back to step 610 of FIG. 6 where the test program and test patterns are loaded. The test is again started in step 620. In step 630 if the device under test 20 fails again, operation proceeds to step 650. If the failure occurred in the same location in the test pattern, the user may try programming a different test vector into programmable register 130 to stretch a different clock cycle. This may be repeated until the failure no longer appears at step 630. When device under test 20 no longer fails, the user may annotate the test vector that was used to cause the part to pass. Operation proceeds to step 670.

Referring back to step 630, if the device fails at a different location in the test pattern, operation proceeds to step 650 where the user may program a test vector into programmable register 130 using the TDI pin. Operation then proceeds to step 660 where the user modifies the test pattern TRIG and MODE pin states. This time the TRIG and MODE pins are modified to allow the fixed test vector to be provided to clock generator circuit 110 of FIG. 3 at the location in the tester pattern where the first failure occurred. Additionally, the TRIG and MODE pin states are modified at the location in the tester pattern causing the second failure, thereby allowing the programmed test vector to be provided to clock generator circuit 110. Operation proceeds to step 610 and to step 620 where during a subsequent test, the programmed test vector is provided to clock generator circuit 110 at the appropriate place in the test pattern for one test cycle. Proceeding to step 630, if the device now passes, operation proceeds to step 670.

The entire process described above may be repeated for each test pattern location causing a failure. Thus a user may have the capability of selectively providing a fixed test vector and therefore a slower frequency during the test cycle of each of the failing locations in the test pattern and additionally providing a programmable test vector and therefore a variable cycle stretch during the test cycle of a subsequent new failing location in the test pattern.

Numerous variations and modifications will become apparent to those skilled in the art once the above disclosure is fully appreciated. It is intended that the following claims be interpreted to embrace all such variations and modifications.

What is claimed is:

1. A test circuit comprising:
   a clock generation circuit configured to receive an input clock signal and to generate an output clock signal; and
   a test clock control unit coupled to said clock generation circuit and configured to selectively provide a user programmable test vector or a fixed test vector to control the generation of said output clock signal by said clock generation circuit depending upon a state of a first mode select signal.

2. The test circuit as recited in claim 1, wherein said user programmable test vector and said fixed test vector are multiple-bit binary values.

3. The test circuit as recited in claim 2, wherein said test clock control unit is configured to store said user program test vector in a programmable register.

4. The test circuit as recited in claim 3, wherein said programmable register is accessible through a joint test action group (JTAG) interface.

5. The test circuit as recited in claim 2, wherein said test clock control unit is further configured to select either of said user programmable test vector or said fixed test vector using a first plurality of multiplexers, one for each bit of said user programmable test vector and said fixed test vector.

6. The test circuit as recited in claim 5, wherein an input select of each of said first plurality of multiplexers is controllable by said first mode select signal.

7. The test circuit as recited in claim 2, wherein said test clock control unit is further configured to selectively provide a multiple-bit bypass test vector to control the generation of said output clock signal by said clock generation circuit depending upon a state of a second mode select signal.

8. The test circuit as recited in claim 7, wherein said test clock control unit is further configured to serially shift each bit of said user programmable test vector, said fixed test vector and said bypass test vector to said clock generation circuit using a shift register.

9. A system comprising:
   a core logic circuit;
   a clock source configured to provide an input clock signal for said core logic circuit; and
   a test circuit coupled between said core logic circuit and said clock source, said test circuit comprising:
     a clock generation circuit configured to receive said input clock signal and to generate an output clock signal; and
     a test clock control unit coupled to said clock generation circuit and configured to selectively provide a user programmable test vector or a fixed test vector to control the generation of said output clock signal by said clock generation circuit depending upon a state of a first mode select signal.

10. The system as recited in claim 9, wherein said user programmable test vector and said fixed test vector are multiple-bit binary values.

11. The system as recited in claim 10, wherein said test clock control unit is configured to store said user programmable test vector in a programmable register.

12. The system as recited in claim 11, wherein said programmable register is accessible through a joint test action group (JTAG) interface.

13. The system as recited in claim 10, wherein said test clock control unit is further configured to select either of said user programmable test vector or said fixed test vector using a first plurality of multiplexers, one for each bit of said user programmable test vector and said fixed test vector.

14. The system as recited in claim 13, wherein an input select of each of said first plurality of multiplexers is controllable by said first mode select signal.

15. The system as recited in claim 10, wherein said test clock control unit is further configured to selectively provide a multiple-bit bypass test vector to control the generation of said output clock signal by said clock generation circuit depending upon a state of a second mode select signal.

16. The test circuit as recited in claim 15, wherein said test clock control unit is further configured to serially shift each bit of said user programmable test vector, said fixed test vector and said bypass test vector to said clock generation circuit using a shift register.

17. A method for providing an output clock signal to a core logic circuit using a test circuit, said method comprising:
   receiving an input clock signal;
   storing a user programmable test vector;
   controlling the generation of said output clock signal by selectively providing said user programmable test vector or a fixed test vector depending upon a state of a first mode select signal.

18. The method as recited in claim 17, wherein said user programmable test vector and said fixed test vector are multiple-bit binary values.

19. The method as recited in claim 18, wherein said storing a user programmable test vector includes storing said user programmable test vector in a programmable register.

20. The method as recited in claim 19, further comprising accessing said programmable register through a joint test action group (JTAG) interface.

21. The method as recited in claim 18, wherein said selectively providing said user programmable test vector or a fixed test vector depending upon a state of a first mode select signal includes using a first plurality of multiplexers, one for each bit of said user programmable test vector and said fixed test vector.

22. The method as recited in claim 21, wherein an input select of each of said first plurality of multiplexers is controllable by said first mode select signal.

23. The method as recited in claim 18 further comprising controlling the generation of said output clock signal by selectively providing a multiple-bit bypass test vector depending upon a state of a second mode select signal.

24. The method as recited in claim 23, wherein said selectively providing said user programmable test vector, said fixed test vector and said bypass test vector includes serially shifting each bit of said user programmable test vector, said fixed test vector and said bypass test vector using a shift register.

* * * * *

UNITED STATES PATENT AND TRADEMARK OFFICE
CERTIFICATE OF CORRECTION

PATENT NO.    : 6,671,848 B1
DATED         : December 30, 2003
INVENTOR(S)   : Jason Dale Mulig and Arnold Louie It is certified that error appears in the above-identified patent and that said Letters Patent is hereby corrected as shown below:

Column 7,
Line 61, please change "program" to -- "programmable" --.

Signed and Sealed this

Eighteenth Day of May, 2004

JON W. DUDAS
*Acting Director of the United States Patent and Trademark Office*